United States Patent
Mantl et al.

(10) Patent No.: US 7,528,058 B2
(45) Date of Patent: May 5, 2009

(54) METHOD FOR PRODUCING A CONTACT AND ELECTRONIC COMPONENT COMPRISING SAID TYPE OF CONTACT

(75) Inventors: Siegfried Mantl, Jülich (DE); Qing-Tai Zhao, Jülich (DE)

(73) Assignee: Forschungzentrum Julich GmbH, Julich (DE)

( * ) Notice: Subject to any disclaimer, the term of this patent is extended or adjusted under 35 U.S.C. 154(b) by 249 days.

(21) Appl. No.: 10/565,990
(22) PCT Filed: Jun. 19, 2004
(86) PCT No.: PCT/DE2004/001294

§ 371 (c)(1),
(2), (4) Date: Jul. 6, 2006

(87) PCT Pub. No.: WO2005/015629

PCT Pub. Date: Feb. 17, 2005

(65) Prior Publication Data

US 2006/0275968 A1    Dec. 7, 2006

(30) Foreign Application Priority Data

Jul. 25, 2003   (DE) ............................... 103 34 353

(51) Int. Cl.
*H01L 21/22* (2006.01)
*H01L 31/0288* (2006.01)
*H01L 21/38* (2006.01)

(52) U.S. Cl. ...................................... 438/554; 257/611
(58) Field of Classification Search ................. 438/530, 438/550, 554, 660; 257/748, 755, 611, 655
See application file for complete search history.

(56) References Cited

U.S. PATENT DOCUMENTS

| 3,849,204 A | 11/1974 | Fowler |
| 2001/0038103 A1 | 11/2001 | Nitta et al. |
| 2002/0094643 A1 | 7/2002 | Solomon et al. |

OTHER PUBLICATIONS

Removal of Dangling Bonds and Surface States . . . by Mang Tao et al. (Appl. Phys. ltrs—Mar. 2003).
Semiconductor-Surface Restauration . . . by E. Kaxiras (Physical Review Mar. 1991).
A Computational Study of Thin-Body, Dougle-Gate. . . .

*Primary Examiner*—Calvin Lee
(74) *Attorney, Agent, or Firm*—Andrew Wilford

(57) ABSTRACT

The invention relates to a method for the production of passivated defining surfaces (6*a*, 6*b*) between a first layer, such as a silicide (5), and an adjacent layer. Passivating elements, such as S, Se and Te are used in said layer structure during said method and the first layer is enriched on the adjacent layer during heat treatment on at least one defining surface. Schottky barriers can be reduced and output work of the transition can be adjusted. Components, e.g. Schottky barrier MOSFETs with small or negative Schottky barriers arc disclosed as source and/or drain contacts and spin transistors.

29 Claims, 6 Drawing Sheets a)

b)

c)

d)

a)

b)

METHOD FOR PRODUCING A CONTACT AND ELECTRONIC COMPONENT COMPRISING SAID TYPE OF CONTACT

CROSS REFERENCE TO RELATED APPLICATIONS

This application is the US national phase of PCT application PCT/DE2004/001294, filed 19 Jun. 2004, published 17 Feb. 2005 as WO 2005015629, and claiming the priority of German patent application 10334353.9 itself filed 25 Jul. 2003, whose entire disclosures are herewith incorporated by reference.

FIELD OF THE INVENTION

The invention relates to a method of making a contact and to electronic components comprising such a contact.

Ohmic metal-semiconductor contacts are made in the microelectronic field with small contact resistances, for example by means of metal-silicon compounds, so-called silicides, like $TiSi_2$, $CoSi_2$, $NiSi$ and the like, on highly doped silicon. To form such highly doped regions in semiconductor substrates, doping depths in silicon of at least 50 to 100 nanometers and even more are required. The doping elements used during the ion implantation, for example arsenic or boron, are distributed in the semiconductor over a certain range [spread]. A subsequent thermal treatment serves to activate the doping element and for diffusion of these doping elements in the semiconductor.

It is a drawback that as a result the doping profile will extend over at least 50 nanometers and in practice more than several hundred nanometers.

This has the effect that comparatively large contacts in terms of the space occupied by them, will result and the corresponding components can thus not be reduced in size further.

The so-called road map for silicon nanoelectronics however requires a further reduction or scaling of such doped regions in order to form extremely flat metal-semiconductor transistors.

In the nanoelectronics field it is therefore advantageous to be able to produce abrupt, ideally sharp-edged metal-semiconductor contacts at an atomic level which have the ohmic properties of semiconductive layers like silicon. The contacts which are thus meant are those having I-V characteristics (graphs) with linear properties and whose contact resistances are as small as possible.

For many applications, metal-semiconductor contacts with diode properties, so-called Schottky contacts, are of the greatest interest. These have a nonlinear diode characteristics which depends upon the Schottky barrier. In the production of such Schottky contacts it is desirable to lower the barrier so that contacts with close to ohmic properties or even fully ohmic properties can be obtained.

Ohmic contacts and Schottky contacts are achieved by a thermal treatment in a hydrogen or deuterium atmosphere to effect a passivation, thereby reducing the density of nonsaturated compounds at the contact interface and thus to improve the electrical and also the optical characteristics.

This type of passivation however alters in a disadvantageous manner or fails to alter the Schottky barrier or the output work of the metal to another layer. It is also a drawback that hydrogen at relatively a low temperature of for example 200 to 300° C. is removed and thus contributes to an abatement fo the passivation effect.

From the state of the art, first results are known for metals which show ohmic properties at such transitions after a passivation of a boundary layer or interface with elements of Group VI of periodic system (chalcogens) between certain pure metals and a semiconductor.

Thus from Kaxiras (Phys. Rev. B43, 6824 (1991)) it is known that the chalcogens sulfur and selenium can be used as adsorbates for the passivation of a silicon surface. As a result, the free surface bonds (dangling bonds) of the silicon are saturated by the adsorbate.

From Tao et al (Appl. Phys. Lett. 82, 1559 (2003)) it is known to make an ohmic contacts with magnesium by means of a passivation layer of selenium. For this purpose at ultrahigh vacuum conditions (UHV) selenium and magnesium are deposited in a molecular beam epitaxy apparatus on a selenium substrate. The selenium layer in the case has a thickness of monolayer on which the metal is deposited under UHV conditions.

The drawback with contacts produced in accordance with this state of the art is that this passivation effect can only exist up to about 300° C. As a result, an industrial fabrication technique, that is a mass production of silicon components is not possible. A further disadvantage is that the passivation effect known from the art can be brought about only with UHV deposition and only with certain relatively few pure metals.

These processes are also not suitable for industrial scale and thus mass production of metal-semiconductor contacts.

It is the object of the invention, therefore, to provide a method of producing ohmic contacts and Schottky contacts with adjustable barrier heights between a first layer and a layer bounding upon, neighboring or adjoining the first layer. It is also an object of the invention to provide components having such contacts with improved versatility as to applications and advantageous characteristics relative to the components made by state of the art techniques.

The objects are achieved by a method according to the main claim and an electronic component according to the auxiliary claim. Advantageous features are given in the patent claims which respectively depend therefrom.

The method of making the contact provides initially for the incorporation of passivation elements in or on the first or the neighboring layer.

It is also possible to apply the passivation elements before the formation of the first layer in the starting materials therefor.

As the neighboring, bounding or adjoining layer, depending upon the selection of the first layer, a semiconductor layer or an insulating layer can be chosen. As the first layer a silicide, a germanide or a pure metal can be selected.

It is also possible to include the passivation elements in the silicide, germanide, metal as the first layers itself or, prior to the silicide formation or germanide formation in the metallic or silicon containing or germanium containing starting component.

By means, of a thermal treatment (elevated temperature treatment) an enrichment of the passivation element in at least one interface or boundary layer between the first layer and the adjoining layer is effected.

In the case in which the passivation element is introduced in the metallic and/or in the silicon or germanium component of the silicide or germanide, the thermal treatment can simultaneously also result in the silicide or germanide formation of the first layer, as self-adjustingly in the enrichment of the interface to the adjoining layer with the passivation element.

The interface or interfaces between the first layer and the bounding layer can be passivated by enriching them with the passivation element and for producing the contact between first layer and the bounding or adjoining layer.

By means of passivation of the interfaces, not only is the simple saturation of free bonds or dangling bonds on the silicon surface meant, but rather, a broader concept is here involved in the case of a metal silicide/semiconductor contact or metal germanide/semiconductor contact where the Schottky barrier is lowered or can even be completely eliminated. The temperature resistance of such contacts is thereby ensured.

In the case of a metal silicide or metal germanide/insulator contact, the work function at the interface is modified or lowered.

During the passivation, the passivation elements locate themselves at the ends of the free bonds and fill the structure at the interface between the first layer and the bounding or adjoining layer.

As the bounding or adjoining layer, for example, a semiconductor layer, for example of silicon, or a dielectric can be selected. The bounding layer can also form a substrate or be provided with a substrate and then can have also a support function.

As the silicide, a metal silicide or a semiconductor silicide is selected.

Within the framework of the invention it is recognized that for producing such contacts the passivation of at least one interface between the first layer and the bounding layer can permit various possibilities in the further in processing since, by contrast with the pure metals which were required by the state of the art, silicides and germanides can also be used.

The silicides/germanides, by comparison to a passivated metal-semiconductor contact with pure metals as the contacts, have a significantly higher thermal stability as an advantage and thus also better processability for subsequent handling. Especially advantageously temperature-resistant contacts can be made which have not been achievable with the methods according to the state of the art.

The method known from the state of the art of sequentially depositing the passivation element and the metal is not comparable with the method according to the invention. Rather the method of the invention results in the self adjustment, that is the locally limited enrichment of the passivation element in the interface or interfaces. This is a prerequisite for electronic components which hitherto have not been able to be fabricated with atomically sharp-edged ohmic contacts on bounding layers like semiconductors of silicon and dielectrics.

The passivation elements herein are either deposited or implanted and the interfaces or boundary layers between the silicide and the adjoining layer can be enriched with the passivation element by a subsequent thermal treatment. It is thus possible to either deposit the passivation element as a layer between the first and adjoining layers or to provide the passivation element directly proximal to the surface of the adjoining layer as the substrate.

It is also possible to introduce the passivation element into or onto the metallic and/or silicon or germanium containing component of a silicide or a germanide to be formed and to use the thermal treatment simultaneously for silicide formation or germanide formation and also for enrichment of the interface with the bounding layer in the passivation element.

It is possible, depending upon the choice of the bounding layer to also provide combinations of these methods. By this it is meant that the passivation element can be introduced into or upon a bounding or adjoining layer or alternatively also in the metallic and/or silicon containing material and, in the case of the formation of a germanide, in the germanium containing component, and then carry out the thermal treatment for the purpose of enrichment and optionally silicide or germanide formation.

Decisive is the active enrichment in the passivation element of the interface or the interfaces between the first layer and the bounding layer following implantation or deposition of the passivation element by the thermal treatment.

For the thermal treatment, the layer structure can be either tempered (heat treated) or oxidized in inert atmosphere at a corresponding temperature.

The enrichment in the passivation element is effected by means of thermally induced segregation from the semiconductor layer or by diffusion of the passivation element out of the first layer into the boundary layer or interface to the adjoining layer.

A precondition for it is that the solubility of the passivation element in the layers be small enough. The enrichment with a previously deposited or implanted passivation element can as has been described, be carried out also during the thermally induced formation of the first layer, that is during the silicide or germanide formation.

A precondition thereto is that the solubility of the passivation element in the first phase be sufficiently small. In that case by the snowplow effect the passivation element is shifted from the silicide or germanide front to the adjacent layer that is for example to a semiconductor layer of silicon or a dielectric.

The thermal treatment is used apart from passivation the interface simultaneously for the formation of the first layer in an especially advantageous aspect of the invention.

As passivation elements, chalcogens like selenium, sulfur or tellurium are selected. Chalcogens like sulfur or selenium show especially strong segregation effects in silicon and silicides/germanides so that the interface between the first and the adjoining layer can be thermally enriched with sulfur or selenium or tellurium.

For the passivation, especially by means of a chalcogen, the passivation element is advantageously introduced with a dose of $10^{12}$ to $10^{16}$ cm$^{-2}$ in corresponding parts of the layer structure, in the silicide or germanide or in their components prior to the formation thereof or in the metal as the respective first layer and/or optionally also in the adjacent layer. For a complete passivation of the interface or interfaces of the first layer with the adjacent layer, the skilled worker will utilize a dose corresponding to an enrichment of about a monolayer of the passivation element. The reduction of the output work of a silicide or of the Schottky barrier can also be brought about with a lesser degree of enrichment.

The passivation of the interface can also be carried out by means of hydrogen or deuterium or generally with ions of Group I of the Periodic System.

The incorporation of the passivation element required for the passivation can be effected as indicated prior to or after the formation of the silicide or germanide. Advantageously this is achieved by having the skilled worker match the sequence of method steps to the material system or vice versa.

As the adjacent layer, not only a simple semiconductor layer or silicon can be conceivable. Rather, strained silicon or germanium which can react with a metal to a germanide or an alloy of Si—Ge, Si—C, Si—Ge—C can be used since these layers can be expected in the future to have increasingly greater significance.

It is also possible to choose as the adjacent layer, not a pure silicon substrate, but the especially thin silicon cover layer of an SOI substrate, as is already produced by mass production, as the substrate for the system of the invention or an SOI substrate with strained silicon, SiGe, Si—Ge—C or Ge as the cover layer.

The production of the metal silicide or metal germanide is effected as described in the state of the art by depositing a metal on a silicon or germanium substrate and then heat treating the stack or by an additional selective deposition, generally selective epitaxy of silicon (or Si—Ge), before the metal deposition in the contact region and subsequent thermal treatment.

From a germanium layer, as the boundary or adjoining layer, upon thermal treatment, a germanide is formed, whereas from an Si—Ge alloy, a ternary M—Si—Ge silicide (M=metal) is formed.

It is also possible, instead of a metal silicide to form a semiconductive silicide as the first layer or to select such a metal silicide or deposit it. As a semiconductor silicide, for example $Ru_2Si_3$ or $P—FeSi_2$ can be considered. By means of passivation of the interface between the silicide and for example the silicon substrate as the adjacent layer, band discontinuities can be altered. Based upon the rule that semiconductor silicides by doping with suitable materials like for example manganese, cobalt, iron, etc. can have magnetic properties and the interface with respect to the silicon substrate will be passivated in accordance with the invention, it is possible to obtain magnetic source and drain contacts and a gate will result for a so-called spin transistor. Polarized electrons can be injected from the magnetic source contact (magnetic semiconductive silicide) in the channel region composed of silicon and by means of the field effect, the so-called Rashba Effect (Rashba E. I., Fiz Tverd. Tela (Leningrad) (1960), Sov. Phys. Solid State 2, 1109 ff, the), the spin direction can be twisted. The spin direction is the source of resistance change upon entry of the polarized electrons in the magnetic region which can be read out as a transistor signal.

In a further advantage of the invention, as the bounding or adjacent layer, no semiconductor layer is selected but rather a dielectric is used whose interface or interfaces to the silicide or germanide or to a metal as the first layer is passivated or will be passivated. As a result one obtains the advantageous effect that the output work of metal silicide/metal germanide insulator contacts and transistors can be adjusted the enrichment of the interface or interfaces of the contact or transition with the passivation element. As with a Schottky contact, the output work is determined by the metal and the isolator.

Metal silicide insulator transitions are expressly advantageous formed as the gate contact in future MOSFETS. The (two layer) silicided polysilicon gate contacts customarily in today's silicon technology, on the gate dielectric, are replaced by a metal contact, for example, of a metallic silicide, in order to further reduce the gate capacity.

For a dielectric, especially $SiO_2$ or $SiO_x$ Ny or an oxide with greater permitivity, a so-called high-K oxide is selected like, for example $HfO_x$, $ZrO_x$, $LaAlO_x$.

The metal component of a metal silicide or metal germanide is advantageously selected from the group which consists of cobalt, nickel, titanium, platinum, tungsten and/or molybdenum.

The metal silicide or metal germanide is then produced advantageously by heat treatment, following which a suitable metal layer is deposited on the adjoining silicon containing or germanium containing layer or is applied thereto.

It is therefore possible in this manner to provide contacts or transitions with passivated boundary layers or interfaces, in summary, between:

a semiconductor silicide as the first layer and a semiconductor layer as the adjoining layer, or a metal silicide/germanide as the first layer and a semiconductor layer or an insulator as the adjoining layer, or a pure metal and an insulator.

The method can be carried out using a mask.

In this manner advantageously, the contact formation is laterally limited.

It is especially advantageous to utilize an $SiO_2$ mask which according to the state of the art can be applied for the self adjusting formation of the metal silicide or metal germanide, simultaneously if the implantation mask for the passivation element.

The advantage obtained by this process applies both in the case of the formation of ohmic contacts as well as for the production of Schottky contacts with adjustable barrier heights and metal silicide or metal germanide insulator transitions with adjustable output work. Thus materials are used which can be processed in a mass or serial production in the field of micro-electronics. Both ohmic contacts or negative Schottky barriers can be made.

Negative Schottky barriers are especially advantageous for ultrafast electronic components since, with negative Schottky barriers a ballistic injection of electrons in an adjoining layer, for example, in a semiconductor, can be achieved (se J. Lungstrum, OS (2002) IEEE TRANS. Electron Devices 49, 1897).

An electronic component according to the invention thus comprises at least one passivated contact made in this manner.

The contacts according to the invention are especially suitable for the production of so-called metal gates in which the output work to the gate dielectric has been adjusted, especially by means of sulfur, selenium or tellurium.

With the method, it is possible to produce, for example, also ultraflat metal silicide-semiconductor contacts for Schottky barrier MOSFETS (SB MOSFETS; MOSFET=Metal Oxide Semiconductor Field Effect Transistor). The ultraflat contacts enables the Schottky barriers at the metal silicide-semiconductor transition to be so reduced or even entirely eliminated that negative Schottky barriers are formed. That enables a scaling of the Schottky barrier MOSFET, especially on silicon on insulator (SOI) substrates also in a multigate arrangement to have gate lengths less than 10 nm).

In the case of a semiconductor silicide as the first layer, spin transistors are obtainable which enable a spin transport from the semiconductor silicide into a semiconductor layer as the adjoining or bounding layer utilizing the so-called RASHBA effect.

BRIEF DESCRIPTION OF THE DRAWING

The invention is described in the following, in connection with nine embodiments and the accompanying seven Figures in greater detail.

SPECIFIC DESCRIPTION

First Embodiment or Example

FIG. 1

Figure 1:
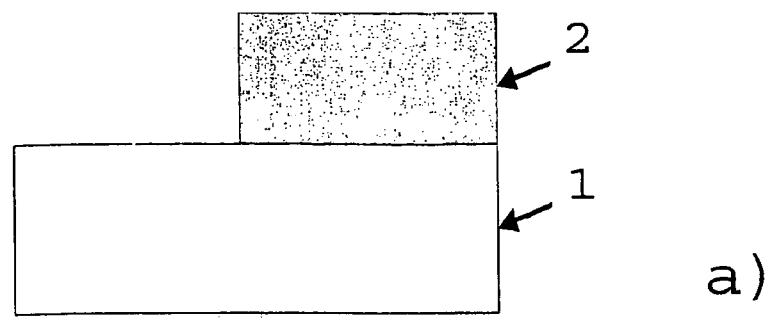
FIG. 1: An illustration of the formation of a passivation contact between a metal silicide as a first layer and a semiconductor layer as the layer bounding the first layer after implantation of the surface of the semiconductor layer 1 with a passivation element and subsequent deposition of a metal layer 4. The metal silicide in the semiconductor contact is formed with passivated boundary layers or interfacial layers 6a, 6b by the heat treatment of the silicide 5 with respect to the semiconductor layer 1.
Figure 1:
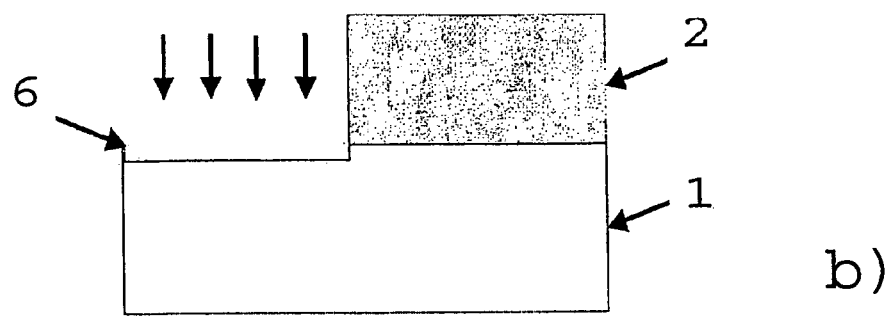
Figure 1:
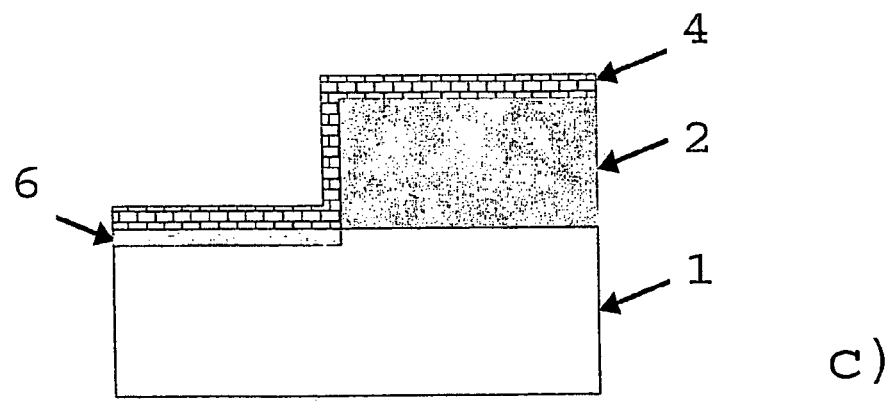
Figure 1:
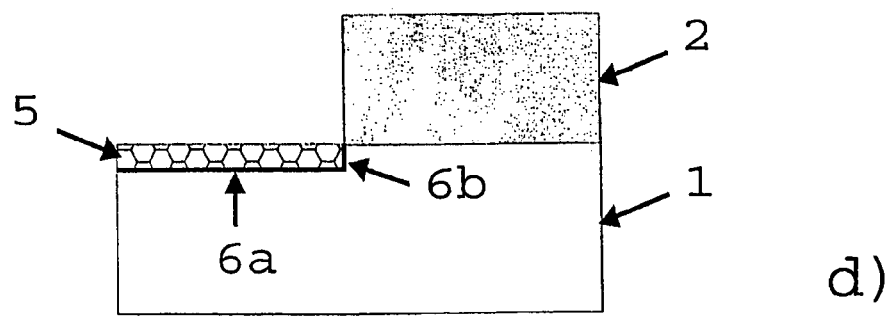

For the formation of a passivated contact between a metal silicide 5 as the first layer and a semiconducting layer 1 as the bounding layer, initially a mask 2, for example of $SiO_2$ is applied to a silicon-containing semiconducting substrate 1, especially of pure silicon (FIG. 1a). With the help of the implantation mask 2, the contact formation as described below is laterally limited.

Then, selenium or sulfur or tellurium as a chalcogen is implanted in the semiconductor layer 1 close to its surface, that is for example up to several 100 nanometers deep. This process is indicated by arrows (FIG. 1b). The dose is so selected that a sufficient passivation will be produced following a thermal treatment or heating treatment. Typically a dose of $10^{10}$ to $10^{15}$ $cm^{-2}$ is implanted. For enrichment of the surface with the chalcogen and to heal implantation defects, a thermal treatment is optionally carried out. After implantation and thus after the formation of the implanted region 6 on or in the semiconductor layer 1, the production of the metal silicide-semiconductor contact is carried out. For this purpose, initially the metallic component 4 of the silicide is selected from the group for example of cobalt, nickel, titanium, platinum, tungsten, molybdenum is deposited as a thin layer of for example 5 to 50 nanometers. In the case of cobalt as the metal, preferably an additional titanium protective layer of for example a thickness of 10 nanometers is deposited before a two-stage heat treatment is carried out for silicide formation (not shown). After the first heat treatment at about 550° C. nonreacted portions of the metal layer are selectively etched away. The second heat treatment is effected in a temperature range of 700° C. to 900° C. for example for 30 seconds. Since the silicide formation is carried out in the region previously implanted with the chalcogen outside the mask 2, the chalcogen is preferably inserted in the interfaces 6a, 6b between metal silicide 5 and the semiconductor layer 1 and thus efficient passivation is achieved. With the simultaneous use of a $SiO_2$ mask as the implantation mask and, for the silicide formation, the formation of the passivation interface is made self-adjusting since the silicide formation and the passivation are carried out at the identical region because of the mask. As a result an ohmic contact or a Schottky contact with small and especially efficient passivation can be produced by means of higher enrichment of the interfaces 6a, 6b with the passivation element even with a negative Schottky barrier.

Second Embodiment or Example

FIG. 2

Figure 2:
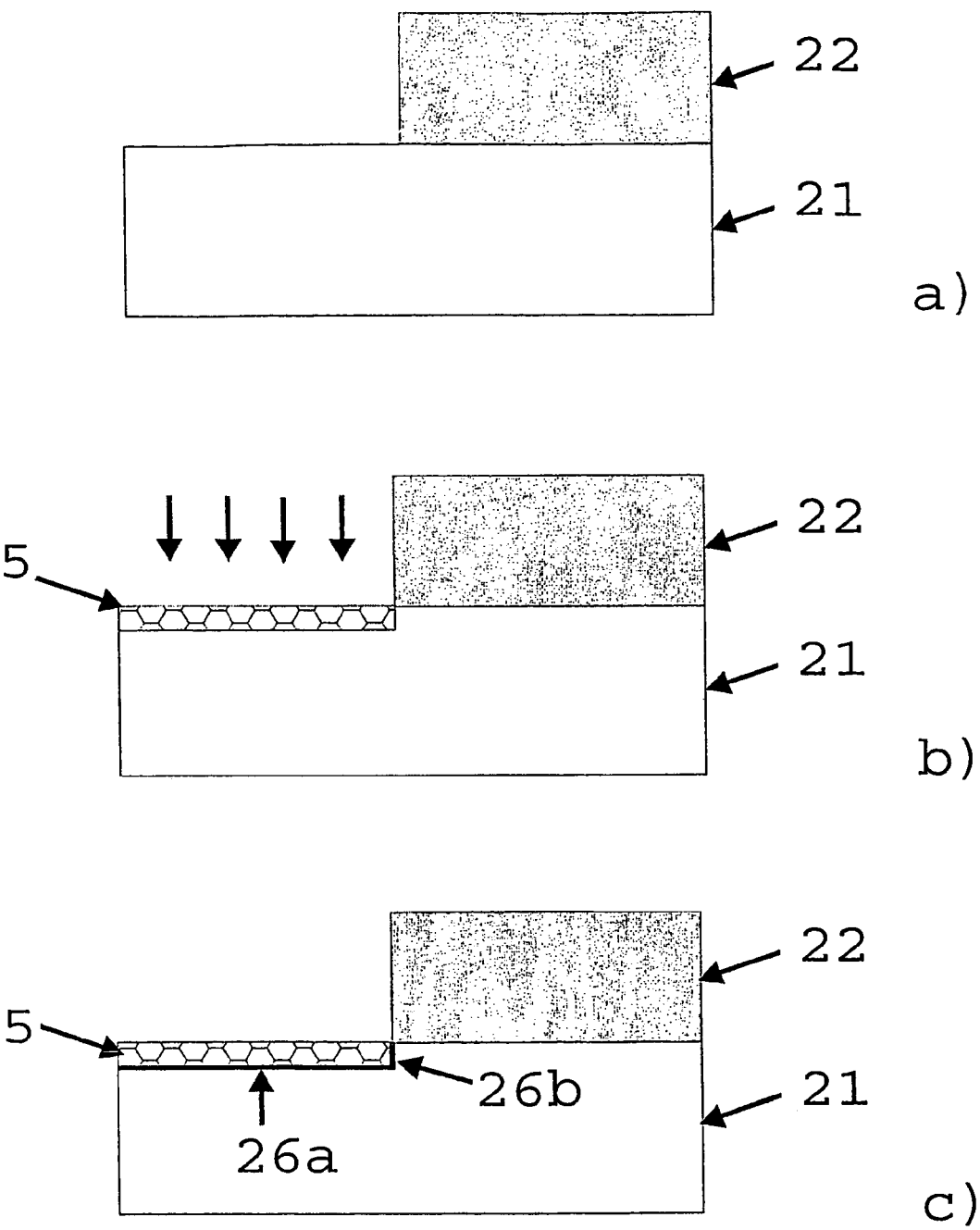
FIG. 2: The formation of a passivated contact between a metal silicide as the first layer and a semiconductor layer as the adjoining layer after deposition of a metal layer (not shown) on a semiconductor layer 21 and a first heat treatment to form the metal silicide 25. This is followed by implantation in the metal silicide and/or in the semiconductor layer of passivation elements. A new heat treatment follows to enrich the interfaces 26a and 26b between the metal silicide 25 and the semiconductor layer 21 with passivation element 21.

For the formation of a passivated contact between a metal silicide 25 as the first layer and a semiconductor layer 21 as the bordering or adjoining layer, again initially a mask 22, for example of $SiO_2$, is applied to a semiconductor substrate 21, especially of silicon as the semiconductor (FIG. 2a). With the aid of the implantation mask 22 of for example $SiO_2$, the contact formation is laterally limited as described below.

By contract with the first embodiment for example, prior to the implantation signified by the arrow of a chalcogen, the metal silicide 25 is first formed on the semiconductor 21. For this purpose a metal is applied to the structure of FIG. 2a and in accordance with the state of the art is converted in a self-adjusting manner in the region not covered with the mask 22 by thermal treatment into a silicide 25. The metal silicide-semiconductor contact is comprised of, for example, $TiSi_2$, $CoSi_2$, $NiSi$, $NiSi_2$, $PtSi$, $WSi_2$ or of another metal silicide to a further semiconductor layer 21. The metal silicide 25 has, as known from the first embodiment for example, boundary layers or interfaces 25a, 25b running horizontally and vertically with respect to the silicon semiconductor layer 21. The metal silicide is thus also arranged in or on the silicon layer 21.

Only upon the formation of the silicide 25 is a chalcogen, for example, sulfur, or selenium or tellurium either directly implanted in the metal silicide 25 and/or in the silicon semiconductor layer 21 near its interface (FIG. 2b). The dose is so selected that after a heat treatment, a sufficient passivation is achieved. For example $7 \times 10^{14}$ $Se^+$ $cm^{-2}$ is implanted in the silicon 21 or close to the interfaces and then heat-treated at a temperature of for example 700° to 1000° C. The interfaces 26a and 26b are thus enriched with the passivation element. In this manner the Schottky-barrier of the silicide 25 at the interfaces with the substrate 21 shown at 26a and 26b is reduced and with increasing passivation fades away so that an ohmic contact (barrier=0) or a negative Schottky contact is formed. The degree of enrichment is determined by the implantation dose and the segregation properties of the passivation element in the substrate.

Third Example or Embodiment

FIG. 3

For the formation of a passivated contact between a metal silicide 35 as the first layer and a semiconductor layer 31 as the neighboring layer, again a mask 32, for example of $SiO_2$, is first applied to the semiconductor substrate 31, especially of silicon as the semiconductor. With the aid of the implantation mask 32 of, for example, $SiO_2$, the contact formation as described below is laterally limited.

Figure 3:
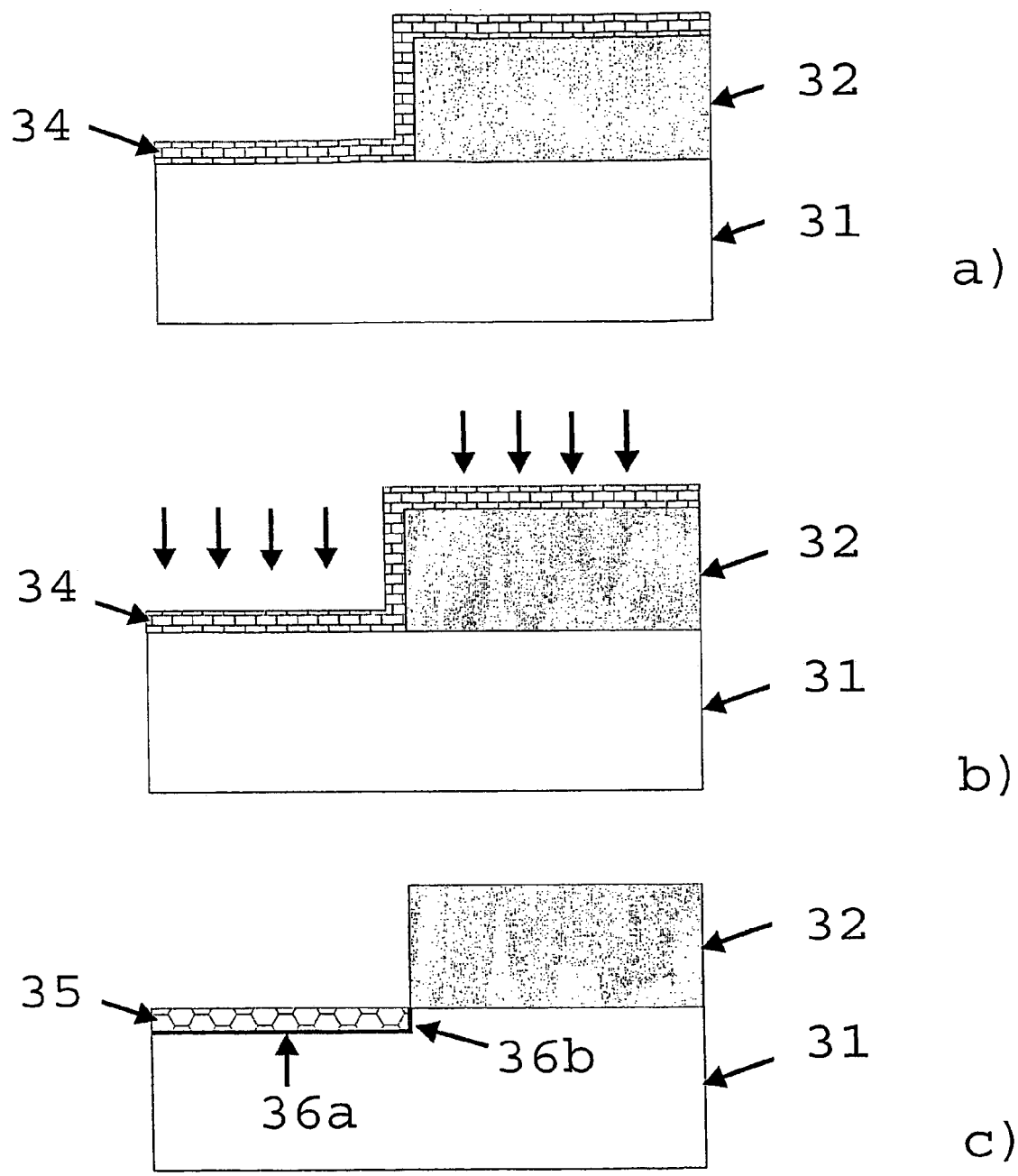
FIG. 3: A diagram of the passivated contact between a metal silicide as a first layer and a semiconductor layer as the layer bounding on the first layer after the deposition of a metal layer 34 on a semiconductor layer 31 the implantation of the passivation element as then effected in the metal 34 and/or in the semiconductor layer 31. That is followed by a single thermal treatment to form the metal silicide 35 and simultaneously enrich the interfaces 36a, 36b between the meal silicide 35 and the semiconductor layer 31 with the passivation element.

Before the implantation, shown by arrows in FIG. 3b, a metal 34, selected from the group for example of cobalt, nickel, titanium, platinum, tungsten or molybdenum is deposited as a thin metal layer 34 of for example 5 to 50 nanometers in thickness.

The implantation is then effected, again as shown by the arrows directly in the metal layer 34 and/or close to the interface between the metal layer 34 and the neighboring layer 31 (FIG. 3b). During the thermal activation metal silicide is formed at 35 and the enrichment of the interfaces 36a and 36b in the passivation element is achieved by segregation from the neighboring layer 31 and/or by diffusion out from the metal silicide 35 to the interfaces 36a, 36b to produce the desired contact (FIG. 3c). A selective etching can be used to remove the nonreacted metal layer.

Fourth Embodiment or Example

FIG. 4

Figure 4:
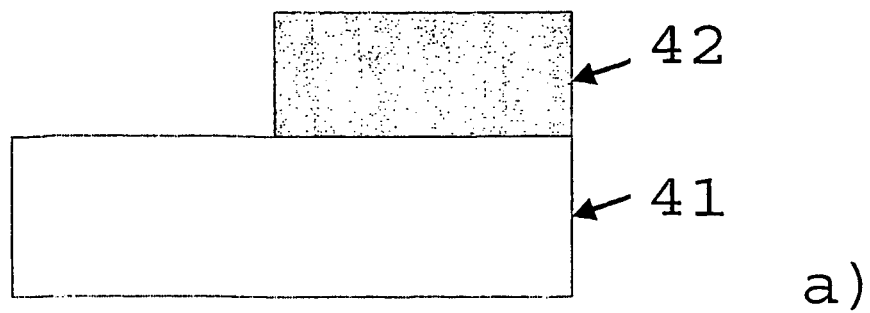
FIG. 4: The formation of a passivated contact between a first layer of a metal silicide and a semiconductor layer as the layer bounding thereon after deposition of a passivation element as the layer 46 on the surface of a semiconductor layer 41 and subsequent deposition of a metal layer 44. A single thermal treatment then follows to form the metal silicide 45 and simultaneously enrich the interfaces 46a, 46b between the metal silicide 45 and the semiconductor layer 41 with the passivation element. The silicide layer 45 is formed only after the deposition of the passivation element and the enrichment follows during the silicide formation by the snowplough effect. The passivation element is not incorporated in the silicide.
Figure 4:
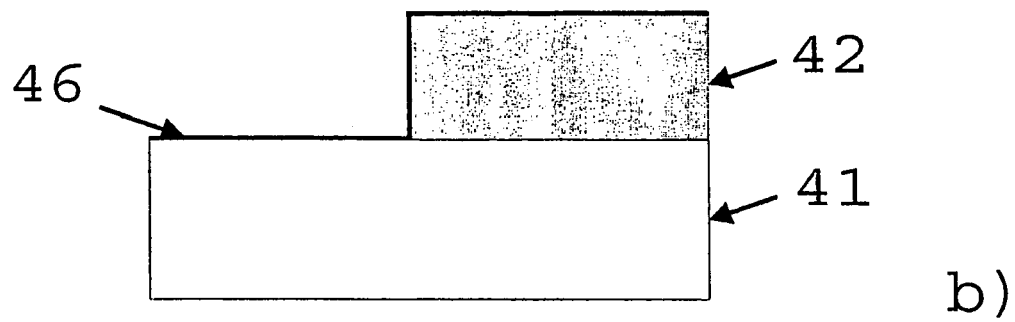
Figure 4:
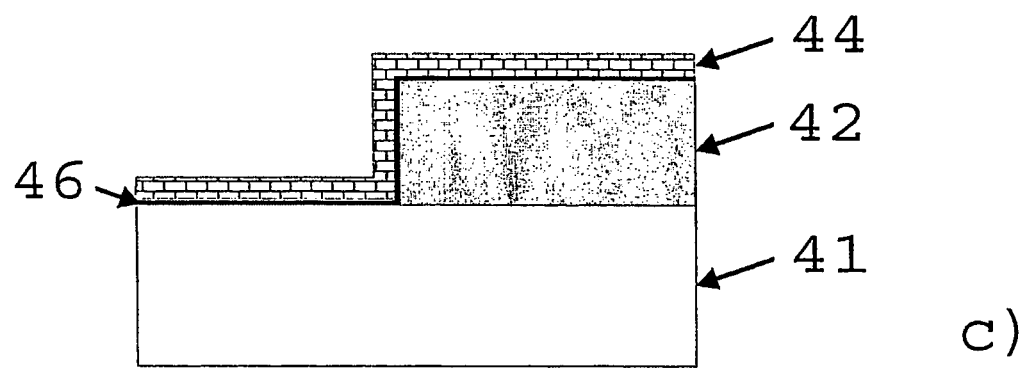
Figure 4:
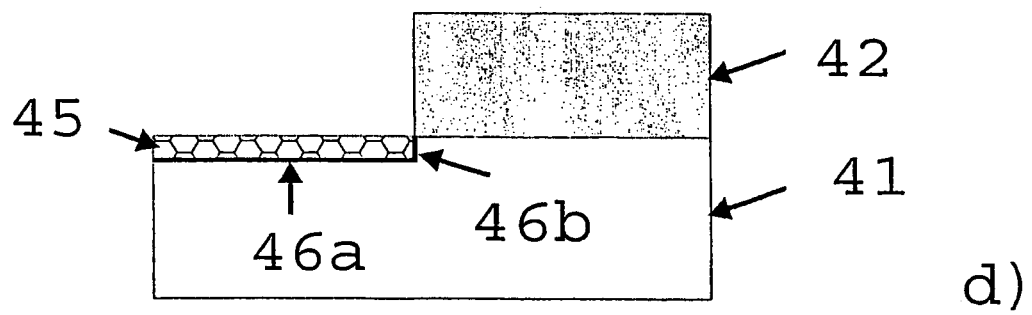

For producing a passivated contact between a metal silicide 45 as the first layer and a semiconductor layer 41 as the neighboring or adjoining layer, initially again a mask 42, for example of silicon dioxide, is applied to a semiconductor substrate 41 wherein the semiconductor is composed of silicon (FIG. 4a). With the aid of the implantation mask 42, for example of silicon dioxide, the contact production is carried out as below its latterly limited form. On this layer structure 42, 41, initially a passivation layer 46, for example a monolayer of chalcogen, is deposited (FIG. 4b).

Then on this layer 46 a metal 44 is deposited (FIG. 4c). This metal can be selected from the group of for example cobalt, nickel, titanium, platinum, tungsten or molybdenum, and is deposited as a thin layer 44 of for example 5 to 50 nanometers on the passivation layer 46.

By heat treatment the contact of metal silicide 45 on the semiconductor layer 41 is formed from the region in which the chalcogen has been deposited and from the chalcogen, the silicon semiconductor layer 41 and the metal 44. During the heat treatment the interfaces 46a and 46b between the metal silicide and the semiconductor layer 41 are enriched in the chalcogen so that an efficient passivation is achieved. The resulting layer structure is thermally so treated that a passivated silicide contact results from silicide formation (FIG. 4d). This means that a temperature treatment is used which both serves for the silicidation and thus the production of the metal silicide/semiconductor contact and also for passivation of the interfaces 46a, 46b.

In the embodiments 1 to 4, the neighboring layer or semiconductor layer has the function of a substrate.

Fifth Embodiment or Example

FIG. 5

With the method according to the invention it is also possible to adjust the output work of a metal gate with this method. A metal or a metal silicide is used as the first layer for gate contact and the output work can be adjusted by means of a chalcogen at the interface to the dielectric 57 serving as the neighboring layer.

Figure 5:
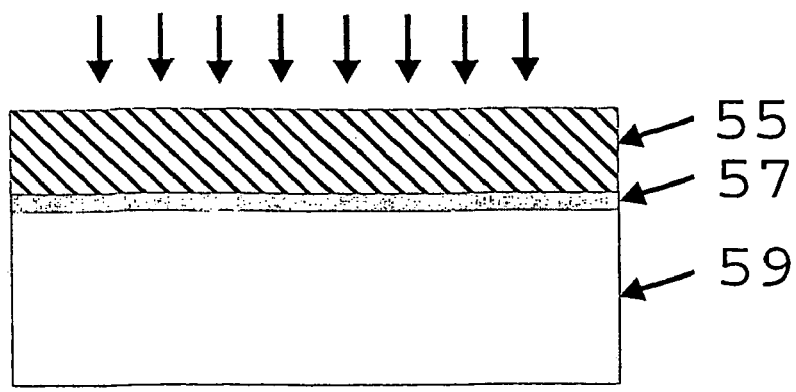
FIG. 5: The arrangement of a metal silicide 55 as a first layer on a dielectric 57 as the bounding layer in the formation of a gate dielectric. The passivation element (arrows) is implanted in the metal silicide 55. That is followed by a thermal treatment for enrichment of a boundary layer or interface with the passivation element, leading to a modification of the output work of the gate contact. Layer 59 is a carrier layer and is comprised for example of a silicon or an SOI-structure substrate.

As in example 2, the chalcogen can be implanted in the previously produced silicide or in the metal contact and by the heat treatment can be enriched in the interface between the metal silicide 55 and the dielectric 57, with the consequence that a change in the output work will result (FIG. 5).

The contact here is comprised of the passivated boundary layer or interface (not shown) between the metal silicide 55 or the metal of the first layer and the dielectric 57 as the adjoining layer. This layer structure is arranged on a carrier layer 59.

Sixth Embodiment or Example

FIG. 6

Figure 6:
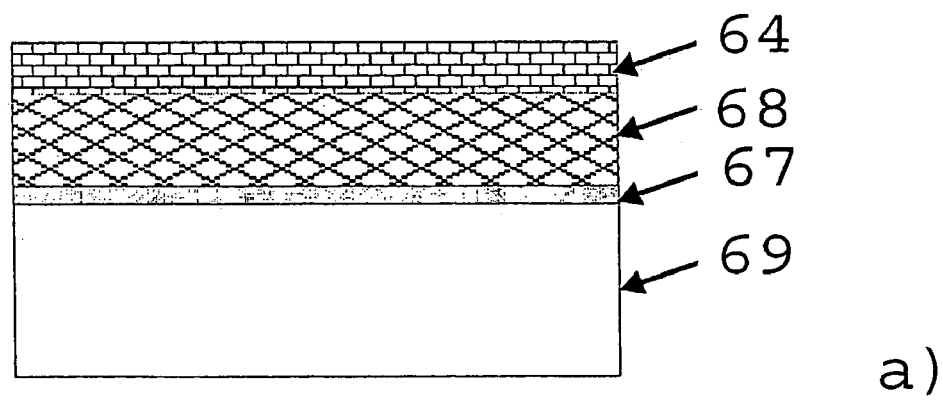
FIG. 6: The formation and arrangement of a metal silicide 65 as a first layer on a dielectric 67 as the bounding layer. Initially the components of the metal silicide are deposited, that is a metal 65 is applied to a polysilicon 68 as these components. The passivation element is preferably implanted in the polysilicon or applied during the deposition. The formation of the silicide 65 and the enrichment of the boundary layer 66a to the dielectric with the passivation element are effected by thermal treatment (FIG. 6b).
Figure 6:
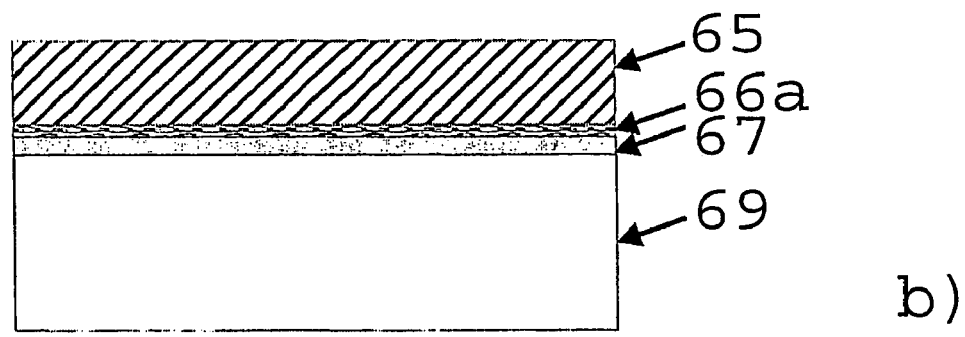

For the formation of a passivated contact between a metal silicide 65 as the first layer and an insulator 67 as the bounding or adjoining layer on a semiconductor substrate 69, initially, one after the other, a dielectric 67, then an amorphous or polysilicon or alternatively a poly-Si—Ge layer 68 and thereon a metal 64, are deposited (FIG. 6a). The passivation element can be deposited with the poly-gate material 68 or also implanted therein (not shown). Layers 68 and 64 contain the silicon and metal components to form the silicide 65.

There follows a thermal treatment which both converts layers 68 and 64 to form the metal silicide 65 and to passivate the interfaces 66a to the dielectric 69 (FIG. 6b). Especially suitable are the silicides $CoSi_2$, $TiSi_2$ and NiSi. In the case of poly Si—Ge as material for layer 68, the ternary silicides $TiSi_x Ge_y$ and $NiSi_x Ge_y$ are especially suitable. For example, selenium can be implanted in the polysilicon 68 and through thermal treatment there will be an enrichment of selenium in the boundary layer or interface between the metal silicide 65 as the first layer and the dielectric 67 as the adjoining layer and thus the output work of the metal silicide 65 to the dielectric 67 will be adjusted. The layer thickness of the polysilicon 68 and the metal 64 are so selected that the polysilicon is completely or almost completely converted to the silicide. Layer 69 is a support layer and is comprised for example of silicon.

Seventh Embodiment or Example

FIG. 7

Figure 7:
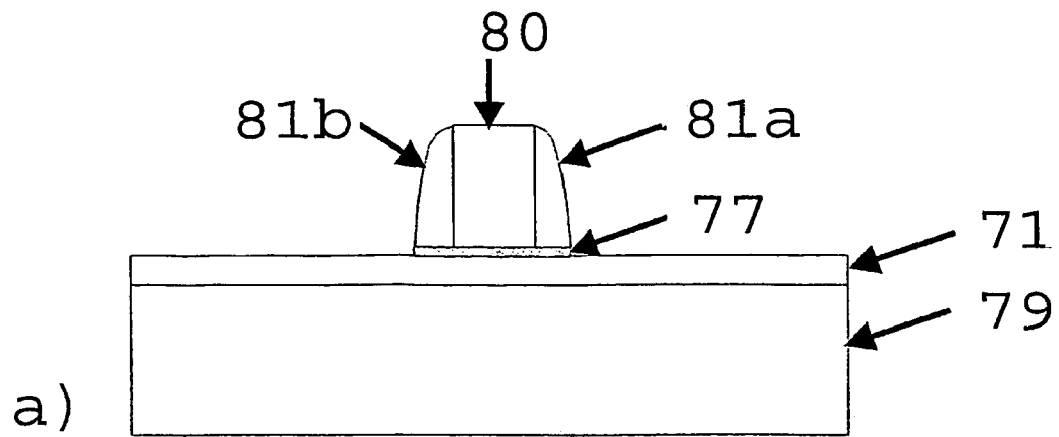
FIG. 7: The production of a Schottky-barrier (SB-) MOSFET with a Schottky-barrier modified by means of passivation. The passivation of the interfaces 76a and 76b is effected by implantation of the passivating element in the source and drain regions of the silicon layer 71 as the first layer and optionally also in the gate material 80 (for example polysilicon) (FIG. 7a).
Figure 7:
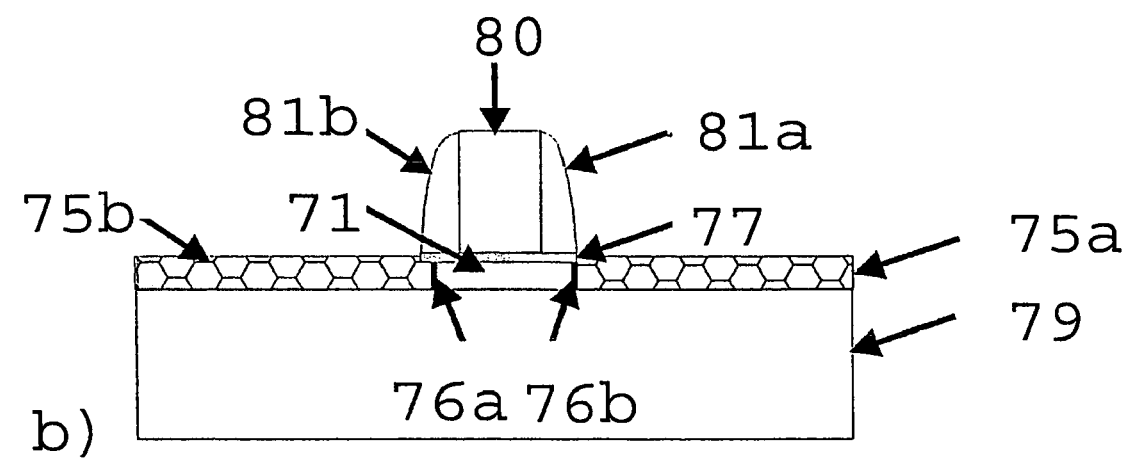

FIG. 7 shows the formation of a Schottky barrier MOSFET with a low or negative Schottky barrier made by passivation of the source and drain contacts.

On an SOI substrate with a thin silicon surface layer 71 with a thickness of 5 to 50 nanometers of an $SiO_2$ layer 79 or upon a surface layer of silicon 71 on an Si—Ge layer 79, after producing the guide structure 80, 81a, 81b (FIG. 7a), the source and drain contacts 7a, 75b are formed by silicidation and passivation according to one of the methods described in examples 1 to 4 (FIG. 7b).

The electronic component structure of FIG. 7a is comprised of a bounding layer formed as a dielectric which is arranged on the semiconductor layer of silicon forming the first layer. The gate contact 80 is the insulating spacer 81a and 81b and the dielectric 77 as indicated, are arranged on a silicon on insulator or on a SiGe substrate 71, 79 (FIG. 7a). The finished electronic component structure has metal silicide 75a, 75b as a first layer with the function of a Schottky source and drain. The interface from source and drain 76a, 76b to the MOSFET channel 71 as the bounding or adjoining layer is enriched with a passivation element by a thermal treatment.

The passivation can for example be effected by implantation of the passivation element in the source region and drain region to be formed later in the silicon layer and optionally also in the gate material 80, for example, in polysilicon. Then a metal is deposited (not shown) and by temperature treatment the metal silicide 75a, 75b can be formed as the source and drain in a self-adjusting manner and optionally also the gate silicide can be formed on polysilicon. The unreacted metal on the spacers 81a and 81b and depending upon the configuration also on the gate 80 can be removed by a wet chemical process. The passivation element enriches the interfaces 76a, 76b during the thermal reactment and reduces the Schottky barrier of the silicide 76a, 76b. Depending upon the degree of enrichment, a contact is formed with a smaller or negative barrier. An ohmic content is produced when the barrier is completely eliminated, that means that the barrier height=0. The gate can alternatively be made with a metal or metal silicide gate contact according to one of the above-described processes (see FIGS. 5 and 6).

It is especially advantageous to form the silicon layer 71 as the starting layer structure on a SOI substrate with a thickness of about at most 30 nanometers and sufficiently small that fully depleted MOSFETs can be formed. When the gate length is extremely small, that means smaller than about 30 nanometers and the passivation of the $CoSi_2$ or NiSi source/drain contact 75a, 75b are made for example with selenium at the source and drain sides of the contact in the channel direction 76a, 76b with negative Schottky barrier, ballistic transport of charge carriers is possible as has been indicated by the Lundstrom simulation calculations.

Eighth Embodiment or Example

FIG. 7

Schottky-barrier-Mosfet with strained silicon or with Si—Ge layer or Si—Ge—C layer 71:

Instead of a normal silicon layer of SOI, especially advantageously, also strained silicon or Si—Ge, Si—Ge—C 71 on SOI 79 can be used to produce Schottky barrier Mosfets.

The silidization and the passivation are effected as in example 6 or in the previous examples.

Instead of a conventional gate construction comprised of silicided polysilicon 80 on $SiO_2$ as the dielectric, a metal gate can also be used in accordance with the embodiments 5 and 6 in order to adjust the output work to the dielectric 77. As the dielectric 77, $SiO_2$ as dielectric, a metal gate can also be used in accordance with the embodiments 5 and 6 in order to adjust the output work to the dielectric 77. As the dielectric 77, $SiO_2$ or an optional high-K oxide can be used.

Ninth Embodiment or Example

As an alternative to the metal silicides mentioned, for producing a contact between a semiconductor silicide as the first layer and a semiconductor layer as the adjoining layer, the semiconductor silicide ($Ru2Si3$, $\beta$-$FeSi_2$) can be applied to the bounding layer and by means of passivation in accordance with one of the above-mentioned processes, the band edge discontinuities of the silicide/silicon contact can be altered. In this manner he electrical transport from the silicide to the silicon is advantageously influenced.

Especially advantageous is the passivation of a boundary layer or interface between a semiconductive silicide with magnetic properties and the silicon as the semiconductor layer. Semiconductive silicides like for example $Ru_2Si_3$, $\beta$-$FeSi_2$ have magnetic properties after doping with Mn, Co, Fe.

The component shown in FIG. 7b is a spin transistor when the source and drain contacts are made from a magnetic semiconductive silicide 75a, 75b. The passivation of the boundary layers or interfaces facilitates the spin transport. By the application of a gate potential, the spin direction can be twisted by means of the Rashba effect so that a spin transistor is provided.

It is basically possible instead of the mentioned metal silicide in the example, to chose also metal germanides as the first layer. Cobalt disilicide semiconductor contacts made in accordance with the invention, especially are temperature stable.

Instead of the above-described single gate MOSFETs, multigate MOSFETS (FinFETs, Omega-Gate MOSFETs) can be made with such contacts.

REFERENCE CHARACTER LIST

1; 21; 31; 41; 71: Semiconductor layer as the bounding or adjoining layer, especially a semiconductor layer of silicon.
2; 22; 32; 42: Mask for example of $SiO_2$, $Si_3N_4$, etc.
4; 34; 44; 64: Metal for the formation of the metal silicide.
5; 25; 35; 45; 55; 65; 75a, b: Metal silicide as the first layer.
6; 46: Region 6 provided with the passivation element; passivation layer 46
6a, b; 26a, b; 36a, b; 46a, b; 66a; 76a, b: Passivated interface between metal silicide and semiconductor layer
57, 67, 77: Gate dielectric ($SiO_2$, $Si_3N_4$, high k material) as adjacent layer.
68: Silicon (poly, amorphous) or Si—Ge
59; 69; 79: Support layer, for example silicon substrate
71: Silicon or strained silicon or germanium semiconductor layer or Si—Ge—, or Si—Ge—C or Si—C layer as adjourning layer.
75a, b: Metal silicide source and drain
76a, b: Passivated interface between metal silicide and semiconductor, here respective interface between source 75a or drain 75b and channel region 71.
79: $SiO_2$ or Si—Ge
80: Gate contact (poly-si, poly-SiGe, metal, silicide)
81a, b: Spacer ($SiO_2$, $Si_3N_4$)

The invention claimed is:

1. A method of making a contact between a first layer comprised of a metal silicide or metal germanide and a substrate adjacent the first layer and including silicon or germanium, the method comprising the steps of:
 a) incorporating by ion implantation close to a surface of the substrate or depositing on the surface of the substrate chalcogen as a passivation element;
 b) depositing on the substrate or on the chalcogen a metal component of the first layer to create a structure; and
 c) thermally treating the structure to form by solid-state reaction the first layer while simultaneously enriching the chalcogen by segregation at least at an interface between the first layer and the substrate to produce the contact.

2. The method according to claim 1, further comprising the step of
using selenium, sulfur or tellurium as the chalcogen.

3. The method according to claim 1 wherein the passivation element is implanted with a dose of $10^{12}$ to $10^{16}$ cm$^2$.

4. The method according to claim 1, further comprising the step of
selecting metal component of the metal silicide or metal germanide from the group of cobalt, nickel, titanium, tungsten or molybdenum.

5. The method according to claim 1 wherein the silicon component of the silicide as the metal silicide is comprised of polysilicon or amorphous silicon.

6. The method according to claim 1, further comprising the step of
providing a mask on the adjoining layer.

7. An electronic component comprised of at least one passivated metal-semiconductor or metal-insulator contact made in accordance with claim 1.

8. A Schottky barrier MOSFET with an adjustable, especially negative Schottky barrier as the source or drain contact of an electronic component according to claim 7.

9. A Schottky barrier MOSFET according to claim 8 wherein the contact has a silicon thickness smaller than 30 nm arranged on an ultra thin SOI substrate.

10. A MOSFET with a gate contact adjusted by means of passivation as an electronic component according to claim 7.

11. A spin transistor as the electronic component according to claim 7 wherein a semiconductor silicide is selected as the metal silicide with Mn or Fe or Co doping for the formation of magnetic source and drain contacts.

12. The method defined in claim 1 wherein the substrate includes Si—Ge—C, Si—C, or Si—Ge.

13. A method of making a contact between a first layer comprised of a metal silicide, metal germanide, or semiconductor silicide and a substrate adjacent the first layer and including silicon or germanium, the method comprising the steps of:
a) depositing on a surface of the substrate a metal component of the first layer;
b) incorporating by ion implantation close to the surface of the substrate chalcogen as a passivation element to create a structure; and
c) thermally treating the structure to form by solid-state reaction the first layer while simultaneously enriching the chalcogen by segregation at least at an interface between the first layer and the substrate to produce the contact.

14. The method defined in claim 13 wherein step a) precedes step b).

15. The method defined in claim 13 wherein step b) precedes step a).

16. The method defined in claim 13 wherein the chalcogen is incorporated in the substrate close to the surface.

17. The method defined in claim 13 wherein the chalcogen is incorporated in the metal component close to the surface.

18. The method according to claim 13, further comprising the step of
using selenium, sulfur or tellurium as the chalcogen.

19. The method according to claim 13 wherein the passivation element is implanted with a dose of $10^{12}$ to $10^{16}$ cm$^{-2}$.

20. The method according to claim 13, further comprising the step of
selecting metal component of the metal silicide or metal germanide from the group of cobalt, nickel, titanium, tungsten or molybdenum.

21. The method according to claim 13 wherein the silicon component of the silicide as the metal silicide is comprised of polysilicon or amorphous silicon.

22. The method according to claim 13, further comprising the step of
using β-FeSi$_2$, Ru$_2$Si$_3$, MnSi$_x$ or CrSi$_2$ as a semiconductor silicide.

23. The method according to claim 13, further comprising the step of
providing a mask on the adjoining layer.

24. An electronic component comprised of at least one passivated metal-semiconductor or metal-insulator contact made in accordance with claim 13.

25. A Schottky barrier MOSFET with an adjustable, especially negative Schottky barrier as the source or drain contact of an electronic component according to claim 24.

26. A Schottky barrier MOSFET according to claim 25 wherein the contact has a silicon thickness smaller than 30 nm on an ultra thin SOI substrate.

27. A MOSFET with a gate contact adjusted by means of passivation as an electronic component according to claim 24.

28. A spin transistor as the electronic component according to claim 24 wherein a semiconductor silicide is selected as the metal silicide with Mn or Fe or Co doping for the formation of magnetic source and drain contacts.

29. The method defined in claim 13 wherein the substrate includes Si—Ge—C, Si—C, or Si—Ge.

* * * * *